(12) United States Patent
Brewer et al.

(10) Patent No.: US 6,522,536 B2
(45) Date of Patent: Feb. 18, 2003

(54) ELECTROSTATIC COOLING OF A COMPUTER

(75) Inventors: James Brewer, Leander, TX (US); Orin Ozias, Cedar Park, TX (US); Forrest Norrod, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 84 days.

(21) Appl. No.: 09/759,422

(22) Filed: Jan. 12, 2001

(65) Prior Publication Data

US 2002/0126448 A1 Sep. 12, 2002

(51) Int. Cl.[7] .................................................. H05K 7/20
(52) U.S. Cl. ....................... 361/687; 361/690; 665/80.3; 174/16.1
(58) Field of Search ................................. 361/687, 695, 361/697, 699, 700, 231, 690; 165/121–126, 80.3; 174/15.2, 16.1

(56) References Cited

U.S. PATENT DOCUMENTS

| | | | | |
|---|---|---|---|---|
| 4,665,707 A | * | 5/1987 | Hamilton | 174/16.1 |
| 5,461,540 A | * | 10/1995 | Lee | 361/687 |
| 6,115,252 A | * | 9/2000 | Ohta et al. | 165/80.4 |
| 6,118,645 A | * | 9/2000 | Partridge | 361/231 |

* cited by examiner

*Primary Examiner*—Darren Schuberg
*Assistant Examiner*—Lisa Lea-Edmonds
(74) *Attorney, Agent, or Firm*—Haynes and Boone, LLP

(57) ABSTRACT

A computer and a method according to which an assembly is provided for electrostatically moving air for cooling the interior of the computer. The assembly includes an ionization strip for selectively receiving high voltage, such that when the high voltage is applied to the ionization strip, charged air rushes toward a heat sink disposed in the computer, thereby creating an airflow through the heat sink.

21 Claims, 3 Drawing Sheets

US 6,522,536 B2

ELECTROSTATIC COOLING OF A COMPUTER

BACKGROUND

The present disclosure relates, in general, to a computer, or other similar electronic device, and, more particularly, to such a computer and method according to which an assembly is provided for electrostatically moving air for cooling the interior of the computer.

As computers, such as central processing units, servers, and other similar types of electronic devices, grow in speed and capacity, power consumed within the system per unit volume (power density) increases dramatically. Consequently, each new generation of computer components generates more heat than the previous generation. It is essential to remove such heat from the computer to ensure that the components remain within their normal operating temperature ranges. Otherwise, the components will have a reduced lifetime, or in some cases, will fail immediately.

In the past, the most popular technique of dissipating heat from a computer has been to provide an internal fan, or fan assembly, to mechanically apply a relatively high-velocity air across the surface of the internal components to cool the components. This raises the convective heat transfer coefficient for the surface of the internal components, thereby increasing the convection cooling.

Although a fan-based system provides reasonably effective cooling, it has several drawbacks. For example, in relatively large systems, a standard sized fan does not have the capacity to cool the internal components, and so a larger fan, or a series of fans must be used. This takes up valuable space in the computer, and creates greater fan noise. Likewise, forcing the air through the computer causes turbulence, which, as will be described, limits the cooling effectiveness. Finally, the fans have mechanically wearing parts, which are relatively unreliable, considering the importance of their role in cooling the computer.

Accordingly, what is needed is a computer incorporating a relatively smaller, quieter, and more efficient assembly for cooling the interior of the computer. It has been shown under laboratory conditions that in the same volumetric flow, electrostatic air movement transfers more heat than a mechanical fan (see "Heat Transfer Enhancement in a Convective Field by Applying Ionic Wind," Tada, Takimoto, and Hayashi; Gordon and Breach Publishing Group; http://www.gbhap.com/fulltext/230/T960100F230.htm). However, until now, the disadvantages associated with electrostatic cooling, such as ozone formation and the required high voltage have discouraged use with computers.

SUMMARY

An embodiment of the present disclosure is directed to a computer and a method according to which an assembly is provided for electrostatically moving air for cooling the interior of the computer. To this end, a computer includes a heat-producing component in the computer chassis. A heat sink is adjacent the component. An ionization strip is adjacent the heat sink. When high voltage is applied to the strip, charged air rushes toward the heat sink creating a cooling airflow.

DETAILED DESCRIPTION

Figure 1:
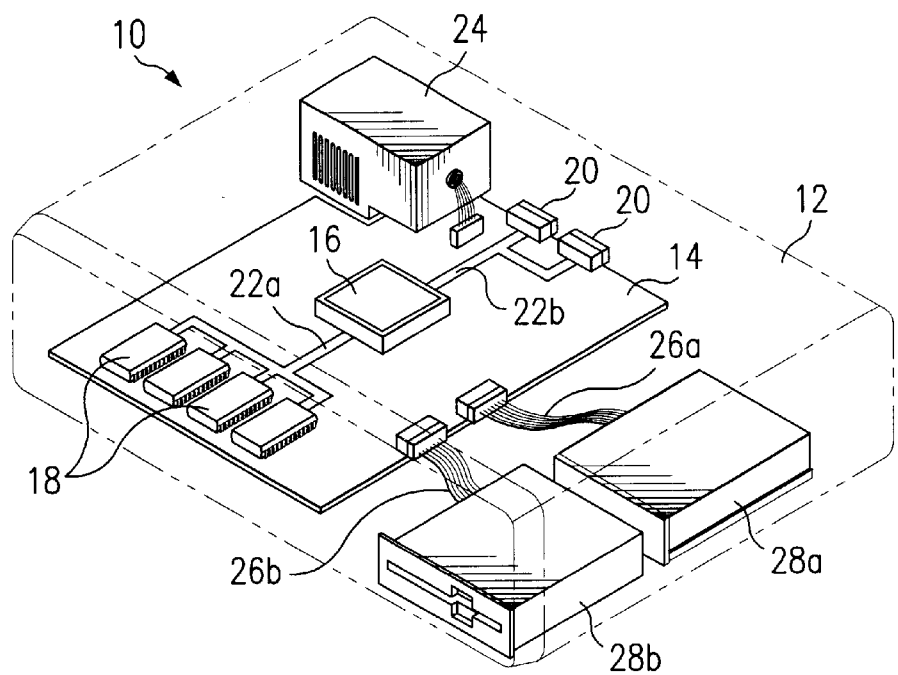
FIG. 1 is a diagrammatic view of an embodiment of a computer.

FIG. 1 illustrates a computer, generally referred to by the reference numeral 10. The computer is understood to be in the form of a desktop computer, a server, a tower computer, or the like. The computer 10 includes a chassis 12 in which a motherboard 14 is mounted. A processor 16 is connected to the motherboard 14, and a plurality of memory devices, or modules 18, and two input/output (I/O) devices 20 are mounted on the motherboard. Two buses 22a and 22b are also provided on the motherboard 14 and connect the processor 16 to the memory modules 18 and to the input/output devices 20, respectively.

A power supply 24 is connected to the motherboard 14. A pair of cable assemblies 26a and 26b connect the motherboard to a hard drive unit 28a and a disk drive unit 28b, respectively. It is understood that other components, electrical traces, electrical circuits and related devices (not shown) are provided in the chassis 12. Because these are all conventional, they will not be described in any further detail.

Figure 2:
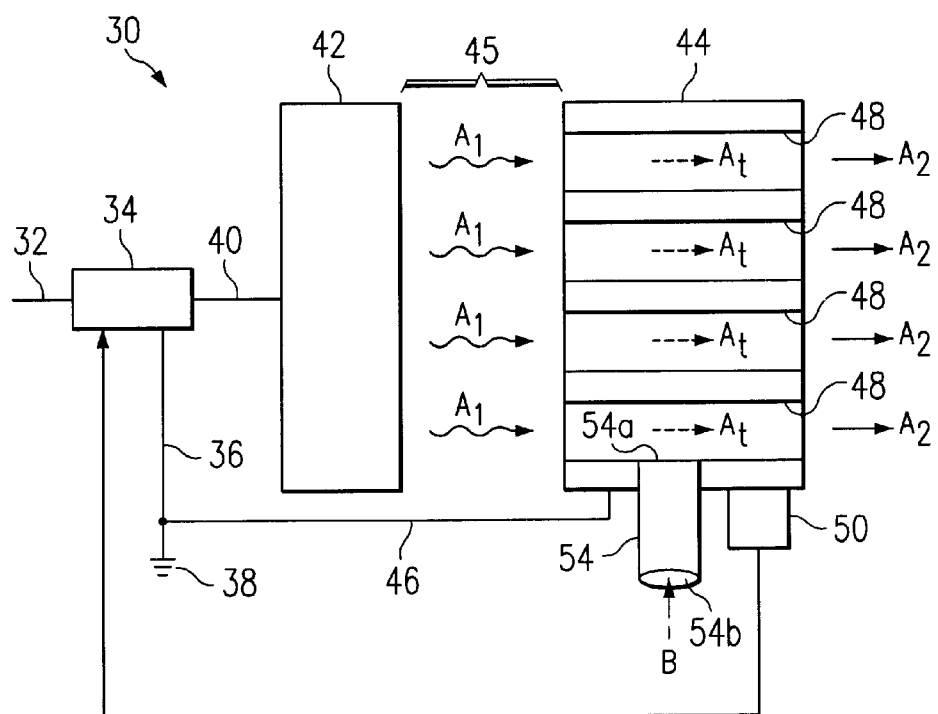
FIG. 2 is a schematic view of a cooling assembly for the computer of FIG. 1.

Referring now to FIG. 2, a cooling assembly is shown for using electrostatic principles to create air movement through the computer of FIG. 1 for cooling the components, the assembly being generally referred to by the reference numeral 30. The assembly 30 comprises an electrical connector 32 connecting the power supply (not depicted) to a step-up circuit 34. The step-up circuit 34 is connected via an electrical connector 36 to a ground 38. Another electrical connector 40 connects the step-up circuit 34 to an ionization strip 42.

As will be explained in greater detail in the description of operation, the ionization strip 42 receives high voltage at the direction of the step-up circuit 34. The high voltage ionizes the surrounding air, which, as represented by the arrows $A_1$, then rushes toward a heat sink 44 across a gap 45. The distance across gap 45 is dependent on the voltage used, but is a distance beyond where arcing would occur. In one embodiment, the gap distance would be 10% to 20% greater than the distance where arcing would occur. The heat sink may be formed from an aluminum alloy or other conventional heat sink materials. The heat sink 44 is connected to the ground 38 via an electrical connector 46.

As mentioned above, ozone ($O_3$) is created when air is ionized. In one embodiment, the surface or channels of the heat sink 44 are coated (painted, sputtered, electro-plated, or annealed) with a catalyst that breaks down ozone created by the ionization of the air, and converts it back to normal oxygen ($O_2$). Examples of such a catalyst are Platinum, Manganese Dioxide, Manganese Oxide, Iodonium, Teledyne WaterPik LTC-95, Engelhard Corp. proprietary catalyst (i.e., U.S. Pat. No. 4,343,776), and Titanium Dioxide, although other ozone decomposing catalysts are contemplated. Some of these catalysts also break down other pollutants found in the air as well. The extent of the decomposition depends on how many ozone molecules come in contact with the catalyst.

The charged air $A_1$ enters a plurality of channels 48 formed in the heat sink 44. The entry of the charged air $A_1$ into the channels 48 creates a net movement of air, or airflow, denoted $A_t$, through each of the channels 48. The greater the voltage that is applied to the ionization strip 42, the more air will be ionized as the charged air $A_1$, and thus, the greater the volume of airflow $A_t$ will be created. As such, it can be appreciated that the airflow $A_t$ is directly related to the amount of voltage supplied to the ionization strip 42, and thus, the step-up circuit 34 indirectly controls the airflow $A_t$.

It is understood that the heat sink 44 is disposed adjacent to a heat-producing component, such as a processor (not depicted). Heat is transferred from the component to the heat sink 44, and thence by convection to the airflow $A_t$. Therefore, the air currents exiting the channels 48, represented by the arrows $A_2$, have a higher temperature than the ambient air entering the heat sink 44. The amount of heat transferred from the heat sink 44, and hence from the component, can be increased by increasing the airflow $A_t$. For simplicity, this heat transfer process from component to heat sink to airflow is referred to as cooling.

A thermostat 50 is disposed in the vicinity of the heat sink 44 for determining the temperature of the environment, or ambient air, surrounding the component. The thermostat 50 is connected to the step-up circuit 34 via an electrical connector 52. Thus, a closed loop is formed between the step-up circuit 34 and the thermostat 50. As observed above, the amount of airflow $A_t$ can be controlled by changing the voltage supplied to the ionization strip 42 to create more cooling or less cooling.

In one embodiment, a heat pipe 54 may also be connected to the heat sink 44. Cooling produced by the removal of heat via airflow $A_t$ in the channel 48 at one end 54a of the heat pipe causes heat, represented as phantom arrow B, to be drawn into the distal end 54b of the heat pipe. The heat is then exhausted along with the currents $A_2$.

In operation, a high voltage, for example, 1 KV to 12 KV, is applied to the ionization strip 42 via the electrical connector 40. The voltage range is found in other consumer electronics devices, such as monitors and televisions, and it is understood that the assembly 30 comprises conventional means for isolating the high voltage discharge from users. The embodiment also contemplates voltages much larger than 12 KV, as those voltages can correspondingly increase the airflow.

Upon reception of the high voltage, the air surrounding the ionization strip 42 is ionized, which can normally be observed as a blue glow. The charged air $A_1$ then quickly accelerates toward and into the grounded conductive heat sink 44 via electrostatic (ionic) effects. It can be appreciated that the greater the surface area of the ionization strip 42, the greater the volume of air that will be moved. Likewise, as mentioned above, a greater volume of air can be ionized with a higher voltage.

The closed loop formed between the step-up circuit 34 and the thermostat 50 can be used to keep the component environment at a relatively constant temperature. For example, if no cooling were needed, no voltage would be supplied to the ionization strip 42 via the step-up circuit 34. If maximum cooling were needed, the ionization strip 42 would be supplied with as high a voltage as practicable, thus causing the largest amount of air to be ionized and thus maximizing the airflow $A_t$, and hence maximizing the cooling. The ability of the assembly 30 to adjust the voltage to control the airflow $A_t$ has a significant efficiency advantage for reducing power consumption, as can be readily appreciated.

Figure 3A:
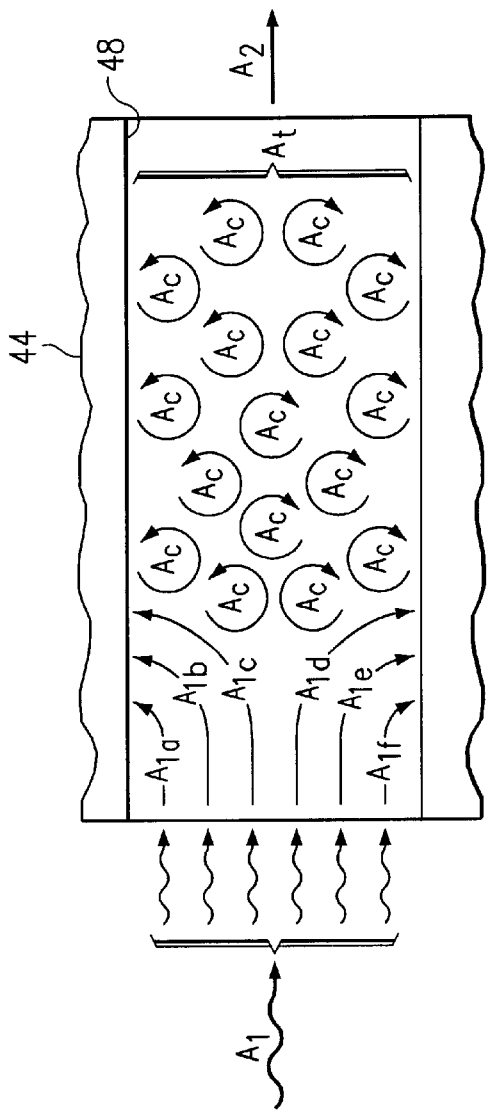
FIG. 3a is a schematic view of air movement in a heat sink of the cooling assembly of FIG. 2.
Figure 3A:
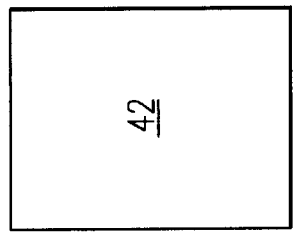

Referring to FIG. 3a, the charged air $A_1$ is illustratively depicted as divided into six exemplary portions, depicted as arrows $A_{1a-f}$. By virtue of the charge received from the ionization strip 42, each of the charged air portions $A_{1a-f}$ seeks to ground with the surface defining a channel 48 of the heat sink 44. This causes great turbulence of air currents, which are depicted with arrows $A_c$, in the channel 48. The ionization enables a high percentage of the air currents $A_c$ to contact the surface of the heat sink 44. This contact results in maximum heat transfer from heat sink to air, and is considerably more efficient at transferring heat into the airflow $A_t$ than traditional fan based techniques, which will be described with respect to FIG. 3b. The increase in efficiency represented in FIG. 3a would enable the use of smaller and lighter weight heat sinks than those presently used in fan cooled computer products, which is advantageous, especially for portable computers.

Moreover, in the coated heat sink embodiment, almost all of the ozone molecules would connect with the heat sink 44, and hence the catalyst, meaning that almost all of the ozone will be converted to oxygen (this includes any ozone which existed in the ambient air prior to ionization). Therefore, using the assembly 30 for cooling could result in the air leaving the computer being cleaner than the air going into the computer.

Figure 3B:
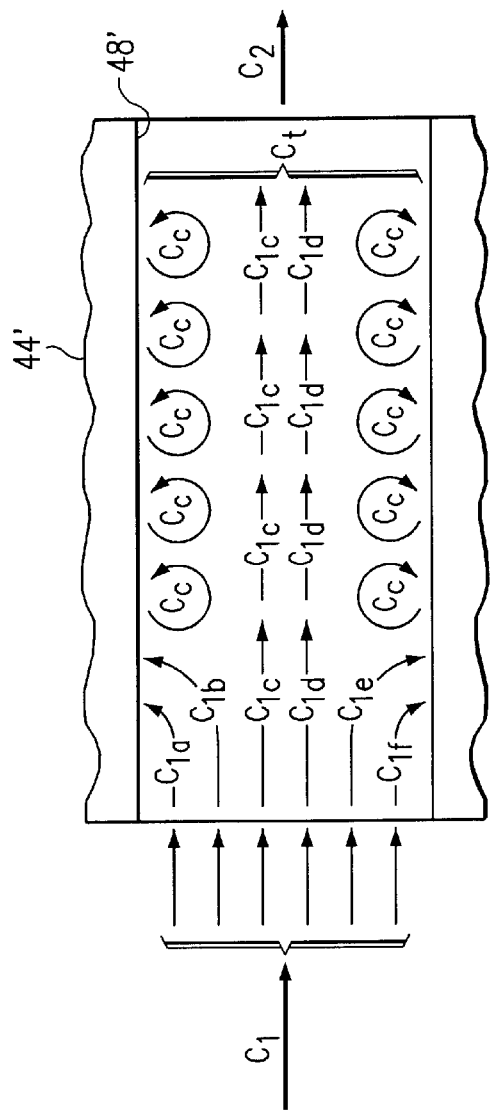
FIG. 3b is a schematic view of forced air movement through a heat sink.
Figure 3B:
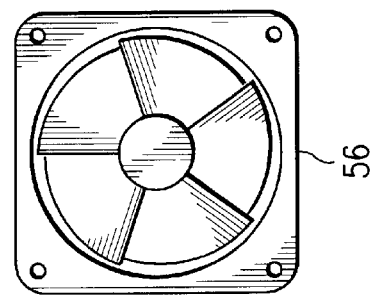

Referring to FIG. 3b, as compared to the foregoing, a conventional fan 56 pushes an air current, denoted as $C_1$, to a channel 48' of a heat sink 44'. The air current $C_1$ is illustrated as divided into six exemplary portions, depicted as arrows $C_{1a-f}$. As will be observed from FIG. 3b, merely forcing air with a fan does not insure that all molecules of the airflow will make physical contact with the surface of the heat sink. For example, any heat transferred to air currents $C_{1c}$ and $C_{1d}$ would result from less heat transfer efficient air-to-air contact with turbulent currents $C_c$, and not from direct contact with the wall of the heat sink 44'. Thus, relatively less heat is transferred to the airflow, denoted $C_t$, than would be transferred to the airflow $A_t$ (FIG. 3a) above. Likewise, if a catalyst were applied to the heat sink 44', the conversion of pollutants would be considerably less efficient, although air leaving the computer would still be cleaner than the air going into the computer.

As opposed to fan-based cooling systems, the assembly 30 (FIG. 2) provides greater reliability, as there are no moving parts to wear out, and achieves greater efficiency, both thermally and catalytically, using the same volume of airflow. Due to the more efficient heat transfer provided by the assembly 30, smaller, lower weight, heat sinks may be used. Furthermore, the assembly 30 is not limited to a relatively bulky diameter like a fan, allowing for flatter, thinner, chassis designs. Finally, the assembly 30 provides quieter operation, and the lack of fan noise creates a better user experience. In the coated heat sink embodiment, the assembly 30 even improves air quality in the immediate vicinity of the computer.

Referring now to FIG. 2 and FIGS. 4–5c, in one embodiment, the ionization strip 42 comprises a plate 60. The plate 60 is formed from a conductive metal, preferably of a stainless steel, although it is understood that any conductive metal may be used. The plate 60 has a receptacle 62 for receiving the electrical connector 40 (FIG. 2), and consequently, high voltage. The plate 60 has a first edge 64 (FIG. 5a), and a second edge 66 (FIG. 5b).

Figure 4:
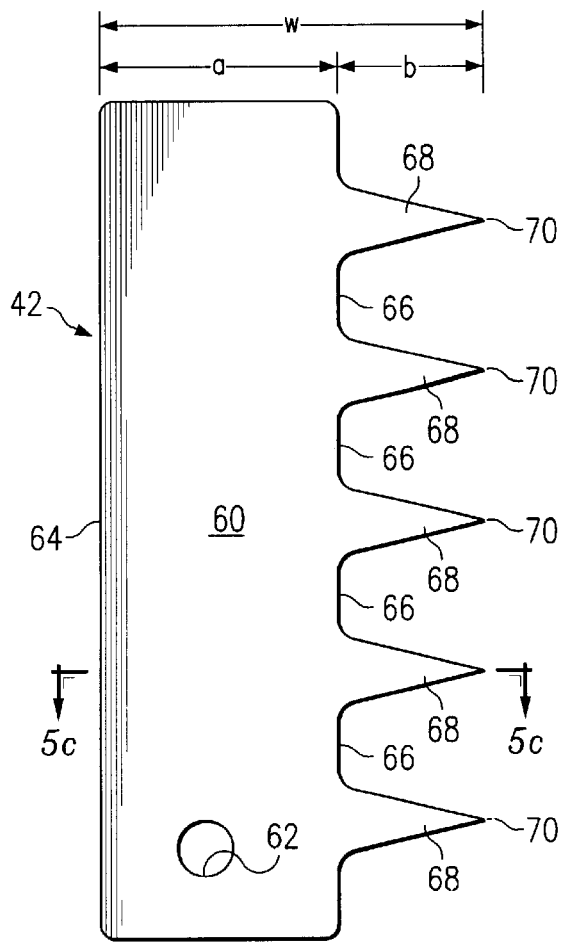
FIG. 4 is a top plan view of an ionization strip of the cooling assembly of FIG. 2.
Figure 5A:
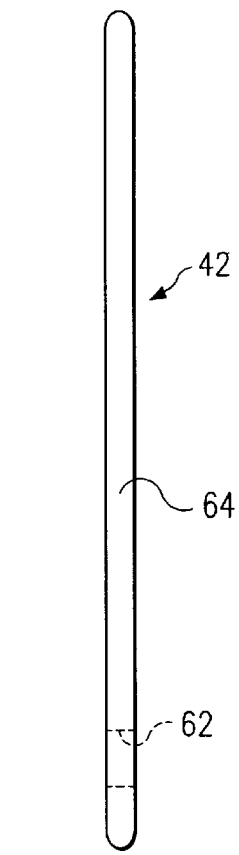
FIG. 5a is a view of one side of the ionization strip of FIG. 4.
Figure 5B:
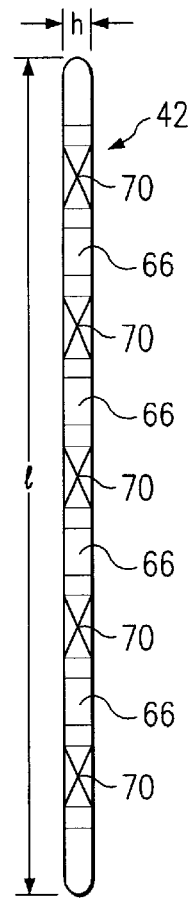
FIG. 5b is a view of another side the ionization strip of FIG. 4.
Figure 5C:
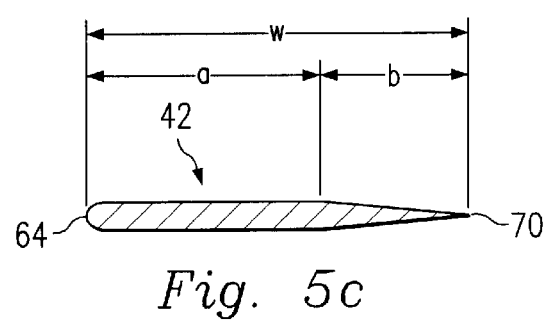
FIG. 5c is a cross-sectional view of the ionization strip taken a long line 5c—5c of FIG. 4.

A plurality of spikes 68 protrude from the second edge 66, terminating in sharp points 70. As illustrated in FIGS. 4–5c, the remaining edges of the plate 60 are rounded. For reliable operation, it is important that the only sharp edges on the plate 60 are at the points 70 of the spikes 68, because high voltage ionization will occur along any sharp edges.

It is understood that in the assembly 30 (FIG. 2), the spikes 68 are directed toward the heat sink 44 (FIG. 2). In one embodiment, the spikes 68 correspond to the channels 48 of the heat sink 44. It can be appreciated that the gap 45, FIG. 2, may vary in distance, but must be small enough that the charged air $A_1$ grounds with the heat sink 44. Although five spikes 68 are depicted, it is understood that the embodiment contemplates varying numbers of spikes. It can be appreciated that the greater the number of spikes, the more ionization of surrounding air that will occur, and the greater the airflow that will be produced.

For illustrative purposes, the plate has a length l (FIG. 5b), a thickness h (FIG. 5b), and a width w (FIGS. 4 and 5c), the width comprising the plate width a combined with the spike length b. In one example, which is given only for illustrative purposes, and in no way limits the scope of the plate dimensions, the plate 60 has the dimensions listed in Table 1, below.

TABLE 1

| Dimension | Inches |
| --- | --- |
| l | 2.75 |
| h | 0.0625 |
| w | 0.5 |
| a | 0.25 |
| b | 0.25 |

However, it is understood that the plate 60 is contemplated to have many other, different dimensions in addition to those listed in Table 1, and particularly, that the dimensions are contemplated to vary greatly as the assembly 30 is adapted for use in various sizes and types of computers.

For example, the ionization strip 42 may comprise an embodiment without spikes (not depicted). This embodiment could take the form of a flat plate with rounded edges on three edges an having a sharpened fourth edge, the plate having a cross section similar to that depicted in FIG. 5c, but along its entire length. Ionization would occur along the length of the sharpened edge. Similarly, a conductive wire could also be used as the ionization strip 42, particularly if the wire were flattened on a side to form an edge.

Likewise, it is understood that all spatial references are for the purpose of example only and are not meant to limit the invention. Furthermore, this disclosure shows and describes illustrative embodiments, however, the disclosure contemplates a wide range of modifications, changes, and substitutions without departing from the scope of the disclosed embodiments. For example, the number of spikes, shape of the ionization strip, and its dimensions can be varied widely.

Also, the embodiments described above are not limited to the use of a computer in a desktop orientation, but are equally applicable to other types and orientations of computers, and even other electronic components. Other modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A computer comprising:
   a chassis;
   a heat producing component in the chassis;
   a heat sink adjacent to the component; and
   an ionization strip adjacent to the heat sink, such that when high voltage is applied to the ionization strip, charged air rushes toward the heat sink, thereby creating an airflow through the heat sink and cooling the component.

2. The computer of claim 1 wherein the heat sink defines at least one channel for receiving the airflow.

3. The computer of claim 1 wherein the high voltage is in the range of 1 KV to 12 KV.

4. The computer of claim 1 further comprising:
   a step-up circuit for controlling application of the high voltage to the ionization strip.

5. The computer of claim 4 further comprising:
   a thermostat attached to the heat sink and the step-up circuit, thereby forming a closed loop for keeping the component environment at a relatively constant temperature.

6. The computer of claim 1 wherein the heat sink is treated with a catalyst.

7. The computer of claim 1 wherein the ionization strip has a plurality of edges and at least one spike extending from one of the edges for directing the charged air toward the heat sink.

8. The computer of claim 7 wherein all of the edges of the ionization strip other than the spike point are rounded.

9. The computer of claim 7 wherein increasing the number of spikes increases the ionization, and hence the airflow through the heat sink.

10. A computer system comprising:
    a chassis;
    a microprocessor mounted in the chassis;
    a memory coupled to provide storage to facilitate execution of computer programs by the microprocessor;
    a heat producing component in the chassis;
    a heat sink adjacent the component; and
    an ionization strip for selectively receiving high voltage, such that when the high voltage is applied to the ionization strip, charged air rushes toward the heat sink, thereby creating an airflow through the heat sink and cooling the component.

11. The system of claim 10 wherein the heat sink defines at least one channel for receiving the airflow.

12. The system of claim 10 wherein the high voltage is in the range of 1 KV to 12 KV.

13. The system of claim 10 further comprising a step-up circuit for controlling application of the high voltage to the ionization strip.

14. The system of claim 10 further comprising a thermostat attached to the heat sink and the step-up circuit, thereby forming a closed loop for keeping the component environment at a relatively constant temperature.

15. The system of claim 10 wherein the heat sink is treated with a catalyst.

16. The system of claim 10 wherein the ionization strip has a plurality of edges and at least one spike extending from one of the edges for directing the charged air toward the heat sink.

17. The system of claim 16 wherein all of the edges of the ionization strip other than the spike point are rounded.

18. The system of claim 16 wherein increasing the number of spikes increases the ionization, and hence the airflow through the heat sink.

19. A method for cooling a computer component attached to a heat sink, comprising:
    providing an ionization strip; and
    applying high voltage to the ionization strip, thereby charging the surrounding air, which rushes toward the heat sink, creating an airflow through the heat sink and cooling the component.

20. The method of claim 19 further comprising providing a thermostat attached to the heat sink and high voltage producing means, thereby forming a closed loop for keeping the component environment at a relatively constant temperature.

21. The method of claim 19 further comprising providing a spike on the ionization strip for directing the charged air toward the heat sink.

* * * * *